US009653772B2

United States Patent
Maxim et al.

(10) Patent No.: US 9,653,772 B2
(45) Date of Patent: May 16, 2017

(54) SEMICONDUCTOR RESONATORS WITH REDUCED SUBSTRATE LOSSES

(71) Applicant: RF Micro Devices, Inc., Greensboro, NC (US)

(72) Inventors: George Maxim, Saratoga, CA (US); Dirk Robert Walter Leipold, San Jose, CA (US); Baker Scott, San Jose, CA (US)

(73) Assignee: Qorvo US, Inc, Greensboro, NC (US)

( * ) Notice: Subject to any disclaimer, the term of this patent is extended or adjusted under 35 U.S.C. 154(b) by 0 days.

(21) Appl. No.: 14/931,621

(22) Filed: Nov. 3, 2015

(65) Prior Publication Data
US 2016/0126925 A1    May 5, 2016

Related U.S. Application Data

(60) Provisional application No. 62/074,446, filed on Nov. 3, 2014.

(51) Int. Cl.
| | |
|---|---|
| *H01L 27/08* | (2006.01) |
| *H01P 7/06* | (2006.01) |
| *H01L 21/027* | (2006.01) |
| *H01L 49/02* | (2006.01) |
| *H03H 9/24* | (2006.01) |
| *H01P 7/08* | (2006.01) |

(52) U.S. Cl.
CPC ............ *H01P 7/06* (2013.01); *H01L 21/0276* (2013.01); *H01L 28/10* (2013.01); *H01P 7/065* (2013.01); *H01P 7/08* (2013.01); *H03H 9/24* (2013.01)

(58) Field of Classification Search
CPC ... H01P 7/06; H01P 7/065; H01P 7/08; H01L 28/10
USPC .......................................... 438/121; 257/531
See application file for complete search history.

(56) References Cited

U.S. PATENT DOCUMENTS

| | | | | |
|---|---|---|---|---|
| 5,478,773 A | * | 12/1995 | Dow ....................... | H01L 27/08 257/E27.046 |
| 8,212,155 B1 | * | 7/2012 | Wright .................... | H01L 23/00 174/259 |
| 2005/0082669 A1 | * | 4/2005 | Saijo ....................... | H01L 24/81 257/737 |
| 2006/0262820 A1 | * | 11/2006 | Itoh ....................... | G11B 7/1353 372/34 |
| 2015/0035637 A1 | | 2/2015 | Maxim et al. | |

* cited by examiner

*Primary Examiner* — Long K Tran
(74) *Attorney, Agent, or Firm* — Withrow & Terranova, P.L.L.C.

(57) ABSTRACT

A resonator includes a laminate, an inductive element on the laminate, and a semiconductor die attached to the inductive element and the laminate. The semiconductor die includes a substrate and a device layout area. The device layout area is separated into a number of device layout sub-areas, each of which has an area between about 1.0 $\mu m^2$ and 100.0 $\mu m^2$. By limiting the area of each one of the device layout sub-areas with the charge carrier trap trenches, the total area of the semiconductor die prone to inducement of eddy currents (i.e., the layer of accumulated charge at the interface of the substrate and the device layout area) is reduced, which in turn reduces interference with the magnetic field of the inductive element and thus improves the performance of the resonator.

12 Claims, 23 Drawing Sheets

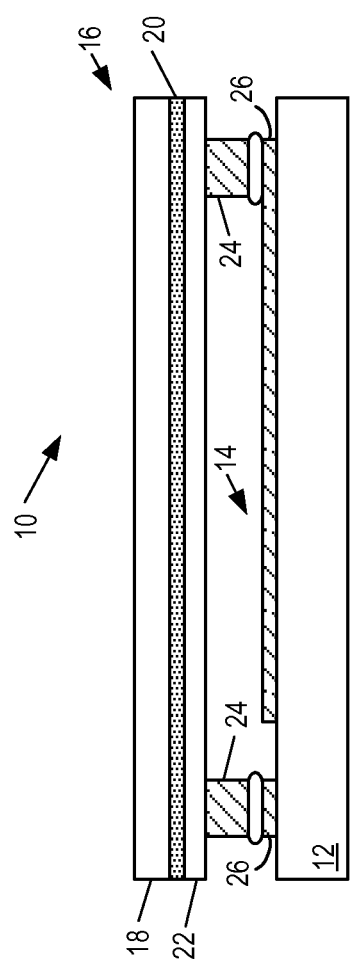

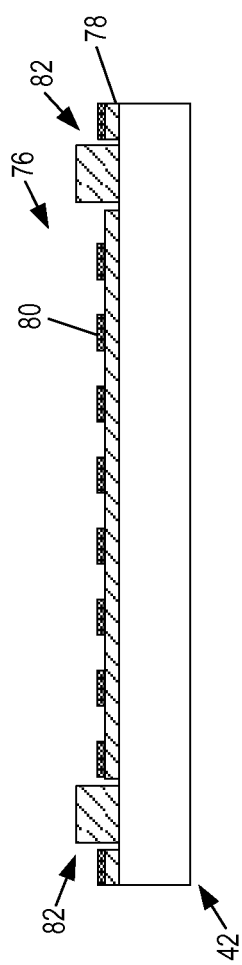

SEMICONDUCTOR RESONATORS WITH REDUCED SUBSTRATE LOSSES

RELATED APPLICATIONS

This application claims the benefit of U.S. provisional patent application No. 62/074,446, filed Nov. 3, 2014, the disclosure of which is incorporated herein by reference in its entirety.

FIELD OF THE DISCLOSURE

The present disclosure relates to semiconductor resonators, and in particular to semiconductor resonators with improvements to the quality factor thereof.

BACKGROUND

Resonators are used in a variety of applications in mobile communications devices. In particular, resonators are often used in filters for mobile communications devices. Resonators for filters generally demand a high quality factor (Q) and selectivity, however, interference in the operation of a resonator due to externalities such as eddy currents often results in sub-optimal performance thereof. FIGS. 1A and 1B show a conventional resonator 10. In particular, FIG. 1A shows an exploded view of the conventional resonator 10 to illustrate one or more details therein, while FIG. 1B shows a cross-sectional view of the conventional resonator 10. The conventional resonator 10 includes a laminate 12, an inductive element 14 on the laminate 12, and a semiconductor die 16 over at least a portion of the inductive element 14 and coupled to the laminate 12. The semiconductor die 16 is a silicon-on-insulator (SOI) semiconductor die including a substrate 18, an insulating layer 20 on the substrate 18, and a device layer 22 on the insulating layer 20 opposite the substrate 18. While not shown, one or more semiconductor devices (e.g., transistors, capacitors, etc.) are located in the device layer 22 and connect to the inductive element 14 (and possibly other components on the laminate 12 or on semiconductor dies attached to the laminate 12), for example, via one or more flip-chip pillars 24, which may connect to one or more bond pads 26 on the laminate 12 via a soldering process. In particular, one or more capacitive elements (not shown), which may be metal-insulator-semiconductor (MIS) capacitors located in the semiconductor die 16, may connect to the inductive element 14 directly or via one or more switching elements (e.g., transistors) to form the conventional resonator 10.

In operation, a magnetic field generated by the inductive element 14 extends outwards towards the semiconductor die 16. Because the conventional resonator 10 is generally used for radio frequency (RF) applications, the magnetic field is time-varying. Accordingly, the magnetic field induces a circular current, known as an eddy current, in the various layers of the semiconductor die 16. Generally, the eddy current induced by a magnetic field is proportional to the strength of the magnetic field, the area available to propagate the eddy current, and the rate of change of the magnetic field, and is inversely proportional to the resistivity of the material in which the eddy current is induced. Since the substrate 18, the insulating layer 20, and the device layer 22 generally have a relatively high resistivity, eddy currents due to the inductive element 14 would typically not be problematic. However, a common phenomenon in SOI semiconductor die is the accumulation of charge carriers at the interface between the substrate 18 and the insulating layer 20. This generates a large cross-sectional area with a relatively low resistivity, resulting in a strong eddy current therein. The eddy current induced in the semiconductor die 16 in turn induces an opposing magnetic field to that provided by the inductive element 14, which interferes with the magnetic field of the inductive element 14 and thereby reduces the quality factor of the conventional resonator 10.

One way to reduce the impact of eddy currents on the performance of the inductive element 14 is by using an electromagnetic shield to limit the penetration of the magnetic field from the inductive element 14 into the semiconductor die 16. Accordingly, FIG. 2 shows a cross-sectional view of the conventional resonator 10 further including a shield 28 between the inductive element 14 and the semiconductor die 16. The shield 28 is on the device layer 22, and includes a number of openings 30 to allow the flip-chip pillars 24 to pass through. The shield 28 includes a conductive base layer 32 and an anti-reflective coating 34. As will be appreciated by those of ordinary skill in the art, the anti-reflective coating 34 is generally provided on the semiconductor die 16 in order to increase the resolution of photolithography processes that may be performed on the die. That is, the anti-reflective coating 34 is the result of a standard fabrication process of the semiconductor die 16 and thus is present in a vast majority of commercially available semiconductor die. Notably, the conductive base layer 32 has a relatively low resistivity, while the anti-reflective coating 34 has a higher resistivity. As discussed above, the strength of an eddy current induced in a particular material is inversely proportional to the resistivity thereof. However, the effect of an induced eddy current on the magnetic field that caused the current is proportional to both the strength of the eddy current and the resistivity of the material in which it is induced. Accordingly, eddy currents induced in the anti-reflective coating 34 may be especially problematic, and result in significant reductions in the quality factor of the conventional resonator 10.

In light of the above, there is a need for resonator circuitry with improved performance.

SUMMARY

The present disclosure relates to semiconductor resonators, and in particular to semiconductor resonators with improvements to the quality factor thereof. In one embodiment, a resonator includes a laminate, an inductive element on the laminate, and a semiconductor die attached to the inductive element and the laminate. The semiconductor die includes a substrate and a device layout area. The device layout area is separated into a number of device layout sub-areas, each of which has an area between about 1.0 $\mu m^2$ and 100.0 $\mu m^2$, by one or more charge carrier trap trenches. By limiting the area of each one of the device layout sub-areas with the charge carrier trap trenches, the total area of the semiconductor die prone to inducement of eddy currents (i.e., the layer of accumulated charge at the interface of the substrate and the device layout area) is reduced, which in turn reduces interference with the magnetic field of the inductive element and thus improves the performance of the resonator.

In one embodiment, the semiconductor die is a semiconductor-on-insulator (SOI) semiconductor die including an insulating layer between the substrate and the device layout area. In other embodiments, the semiconductor die is a bulk complementary metal-oxide semiconductor (CMOS) semiconductor die, a bi-CMOS semiconductor die, a Silicon bipolar semiconductor die, a Silicon-Germanium semiconductor die, or any other semiconductor die having a low-resistivity substrate.

In one embodiment, the device layout sub-areas are arranged in a grid. The one or more charge carrier trap trenches may run through the device layout area such that a bottom surface of the carrier trap trench is located in the substrate. Further, each of the one or more charge carrier trap trenches may include a trap-rich implant in the bottom surface thereof. The trap-rich implant may be configured to prevent the collection of charge carriers at the interface between the substrate and the insulator layer. The remainder of the charge carrier trap trench may be filled with a semiconductor material or an oxide material.

In one embodiment, the resonator has a quality factor between about 50 and 1000. The inductive element may be a three-dimensional inductor in some embodiments, which may increase the quality factor of the resonator.

In one embodiment, a resonator includes a laminate, an inductive element on the laminate, and a semiconductor die attached to the inductive element. The semiconductor die includes a substrate and a device layout area. The device layout area includes a number of device layout sub-areas, each separated from one another by a number of charge carrier trap trenches such that the device layout areas are arranged in a grid. By dividing the device layout area into a grid separated by the charge carrier trap trenches, the total area of the semiconductor die prone to inducement of eddy currents (i.e., the layer of accumulated charge at the interface of the substrate and the device layout area) is reduced, which in turn reduces interference with the magnetic field of the inductive element and thus improves the performance of the resonator.

In one embodiment, the semiconductor die is a semiconductor-on-insulator (SOI) semiconductor die including an insulating layer between the substrate and the device layout area. In other embodiments, the semiconductor die is a bulk complementary metal-oxide semiconductor (CMOS) semiconductor die, a bi-CMOS semiconductor die, a Silicon bipolar semiconductor die, a Silicon-Germanium semiconductor die, or any other semiconductor die having a low-resistivity substrate.

In one embodiment, a method begins by providing a semiconductor die including a substrate and a shield on the substrate. The shield includes a base metal layer and an anti-reflective coating on the base metal layer. At least a portion of the anti-reflective coating is removed such that a surface of the base metal layer is exposed through the anti-reflective coating. A laminate including an inductor is then provided. The semiconductor die is attached to the laminate. By removing at least a portion of the anti-reflective coating, the metal layer under the anti-reflective coating is exposed to an electromagnetic field from the inductor through the openings in the anti-reflective coating. This ensures that eddy currents induced in the anti-reflective coating are significantly reduced, thereby improving the performance of a resonator resulting from the method.

In one embodiment, at least 50%, and up to 100%, of the anti-reflective coating is removed. The portions of the anti-reflective coating removed may be limited to those exposed to the electromagnetic field of the inductor. Removing at least 50% of the anti-reflective coating ensures that significant eddy currents are not induced in the anti-reflective coating, thereby increasing the performance of the resulting resonator. In another embodiment, the anti-reflective coating is patterned into a grid. In yet another embodiment, the anti-reflective coating is removed such that a continuous surface of the anti-reflective coating is limited to an area less than about 100.0 μm².

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 1B is a cross-sectional view of a conventional resonator.

FIGS. 9A through 9E illustrate a method for manufacturing a resonator according to one embodiment of the present disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1A:
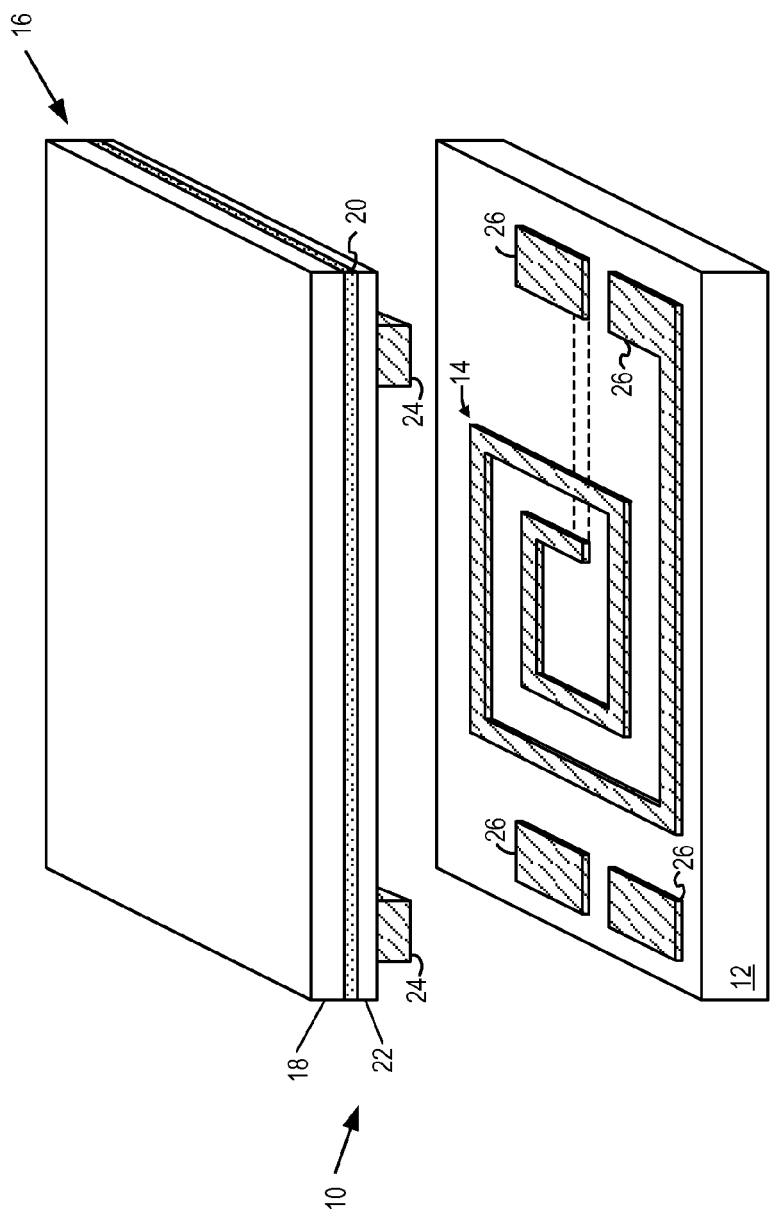
FIG. 1A is an exploded view of a conventional resonator.
Figure 2:
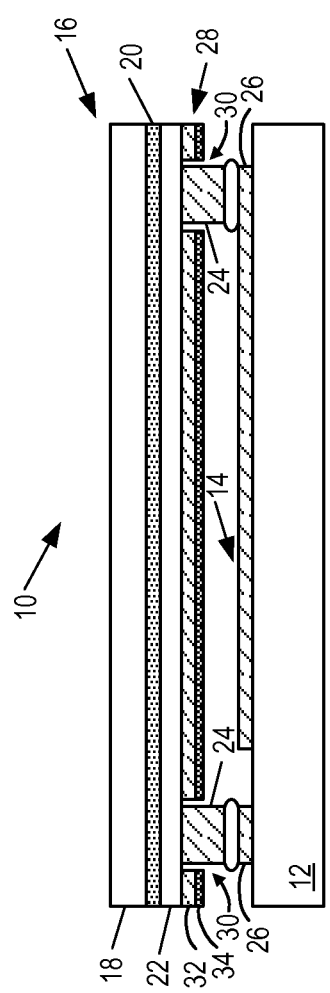
FIG. 2 is a cross-sectional view of a conventional resonator including a shield.
Figure 3A:
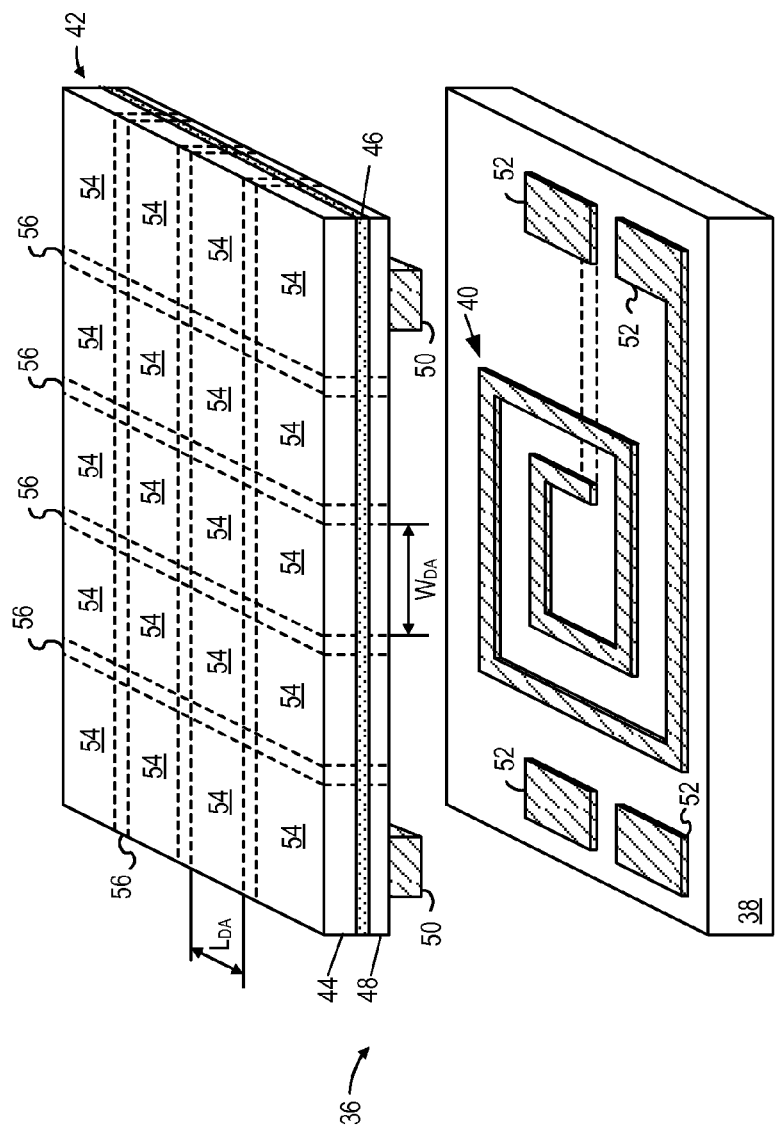
FIG. 3A is an exploded view of a resonator according to one embodiment of the present disclosure.
Figure 3B:
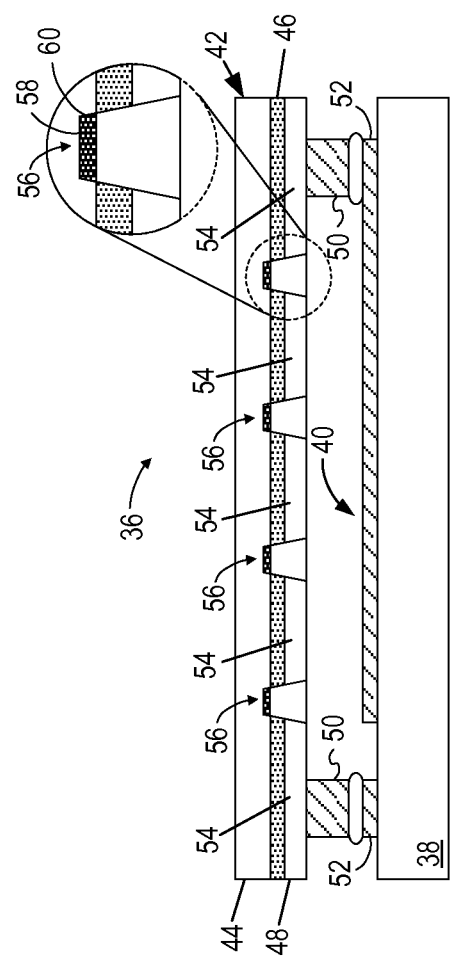
FIG. 3B is a cross-sectional view of a resonator according to one embodiment of the present disclosure.
Figure 4:
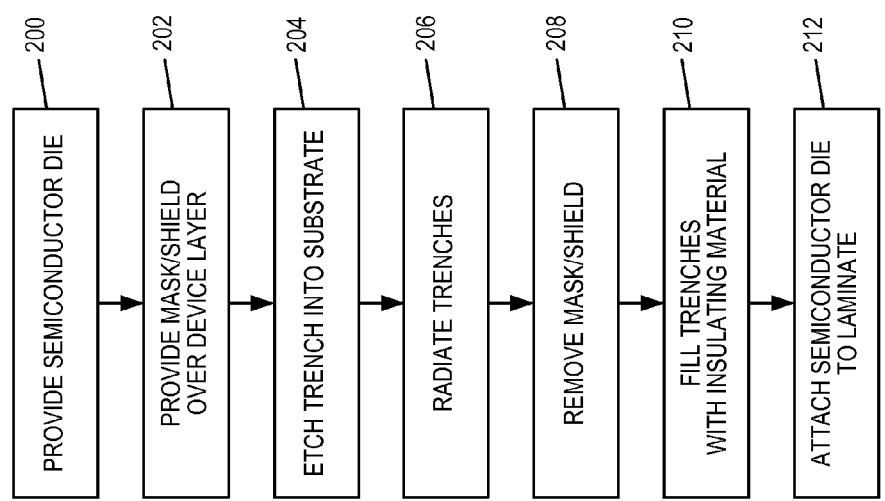
FIG. 4 is a flow chart describing a method for manufacturing a resonator according to one embodiment of the present disclosure.
Figure 5A:
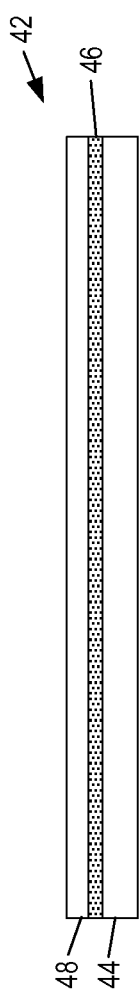
FIGS. 5A through 5G illustrate a method for manufacturing a resonator according to one embodiment of the present disclosure.
Figure 5B:
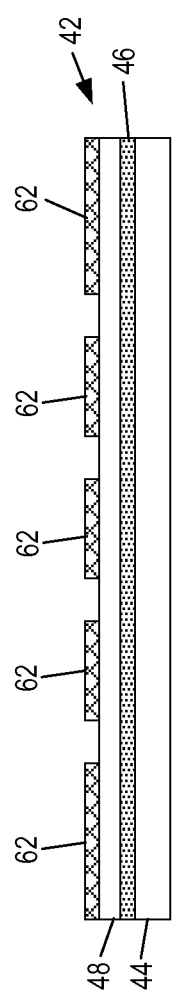
Figure 5C:
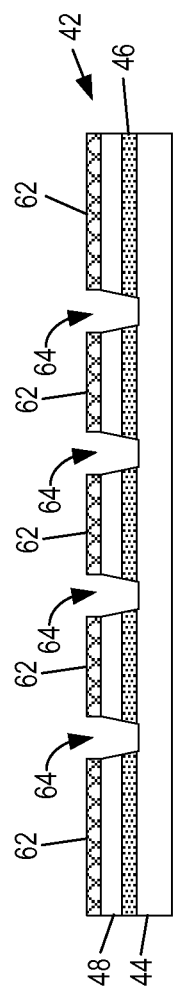
Figure 5D:
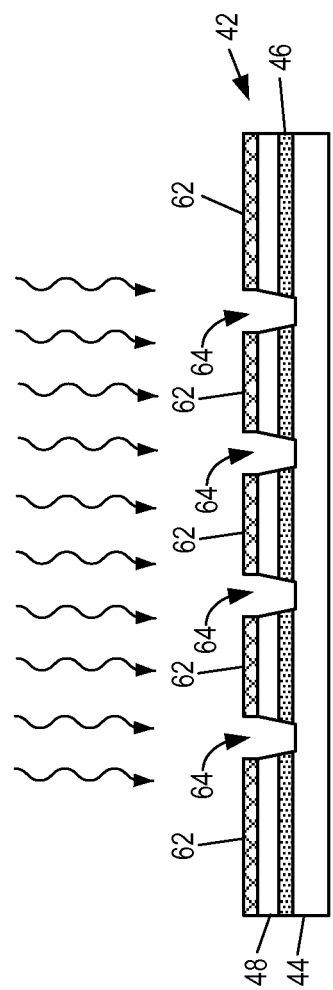
Figure 5E:
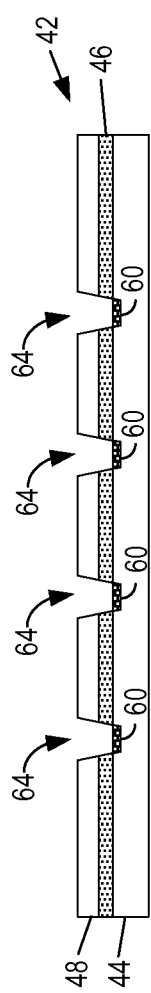
Figure 5F:
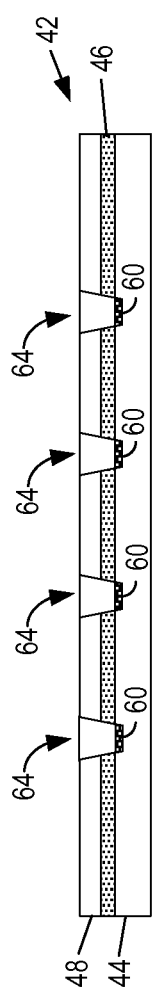
Figure 5G:
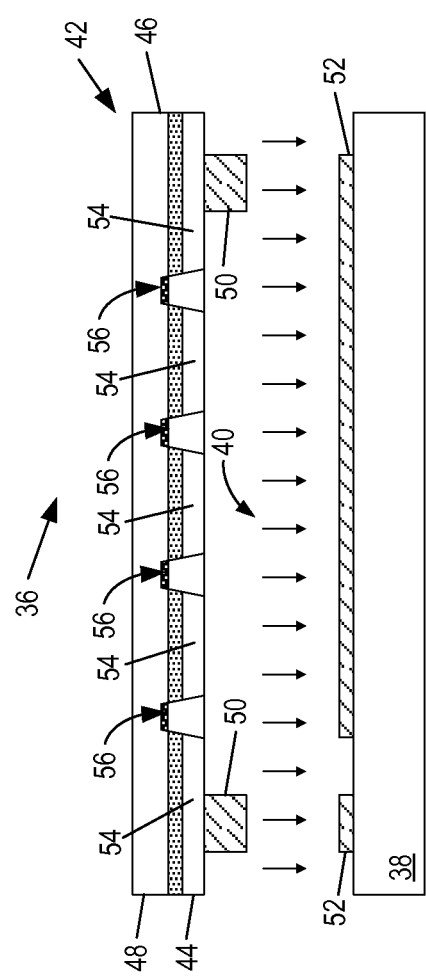

Turning now to FIGS. 3A and 3B, a resonator 36 is shown according to one embodiment of the present disclosure. Specifically, FIG. 3A shows an exploded view of the resonator 36, while FIG. 3B shows a cross-sectional view of the resonator 36. The resonator 36 includes a laminate 38, an inductive element 40 on the laminate 38, and a semiconductor die 42 over at least a portion of the inductive element 40 and coupled to the laminate 38. The semiconductor die 42 may be a silicon-on-insulator (SOI) semiconductor die including a substrate 44, an insulating layer 46 on the substrate 44, and a device layer 48 on the insulating layer 46 opposite the substrate 44. While not shown, one or more semiconductor devices (e.g., transistors, capacitors, etc.) may be located in the device layer 48 and connect to the inductive element 40 (and possibly other components on the laminate 38 or on semiconductor dies attached to the laminate 38), for example, via one or more flip-chip pillars 50, which may connect to one or more bonding pads 52 on the laminate 38 via a soldering process. In particular, one or more capacitive elements (not shown), which may be metal-insulator-metal (MIM) capacitors located in the semiconductor die 42, may connect to the inductive element 40 directly or via one or more switching elements (e.g., transistors) to form the resonator 36.

Notably, as discussed above, a layer of charge carriers may accumulate at the interface of the substrate 44 and the insulating layer 46 in the semiconductor die 42. This layer of charge carriers may form a large cross-sectional area with a relatively high conductivity, resulting in the induction of a strong eddy current therein by the inductive element 40 in conventional resonators. Accordingly, the semiconductor die 42 in the resonator 36 includes a number of device layout areas 54, each of which is separated by one or more charge carrier trap trenches 56. The charge carrier trap trenches 56 effectively break the area available for charge carrier collection at the interface of the substrate 44 and the insulating layer 46 into a number of smaller areas, which reduces the eddy current generated therein and thus prevents interference with the magnetic field of the inductive element 40. This in turn prevents reductions in the quality factor of the inductive element 40 that are often associated with eddy currents.

In one embodiment, the area of each one of the device layout areas 54 is between than about 1.0 µm$^2$ and 100.0 µm$^2$. In some embodiments, the maximum allowable area of the device layout areas 54 may be dependent on the size of the inductive element 40 and the strength of the magnetic field generated therefrom. As shown in FIG. 3A, the charge carrier trap trenches 56 may separate the device layout areas 54 such that they are arranged in a grid. However, the device layout areas 54 may be arranged in any manner without departing from the principles of the present disclosure. Instead of the area of the device layout areas 54, the resonator 36 may also be characterized by the distance between the charge carrier trap trenches 56. Each of the charge carrier trap trenches 56 may be less than 200.0 µm away from one another in some embodiments, and as close together as 5.0 µm. In general, this applies to portions of the charge carrier trap trench 56 that are parallel to one another such that the distance from adjacent portions of the charge carrier trench 56 defines a width $W_{DA}$ of one of the device layout areas 54. In one embodiment, the charge carrier trap trench 56 accounts for at least 10% of the total area of the device layer 48, and up to 50% thereof. The charge carrier trap trench 56 may penetrate into the device layer 48 and to the substrate 44 such that the charge carrier trap trench 56 has a depth between about 5 µm and 100 µm.

The charge carrier trap trenches 56 may run through the device layer 48 and the insulating layer 46 such that a bottom surface 58 of the charge carrier trap trench 56 is in the substrate 44. A trap-rich implant 60 may be located in the bottom surface 58 of each one of the charge carrier trap trenches 56. The trap-rich implant 60 may be provided via an ion implantation process or any other suitable process, and is generally configured to trap and neutralize charge carriers in the substrate 44 such that they do not concentrate at the interface between the substrate 44 and the insulating layer 46. This in turn prevents the formation of a continuous cross-sectional area with a relatively low resistivity, which reduces the eddy currents generated in such a layer. Notably, the effect of the trap-rich implant 60 is localized, such that at a certain distance from the trap-rich implant 60, charge carriers are free to move in the substrate 44. The charge carrier trap trench 56 may be filled with an oxide material, such as silicon dioxide. In general, any insulating material may be used to fill the charge carrier trap trench 56.

The resonator 36 may include any number of charge carrier trap trenches 56 arranged in any suitable fashion without departing from the principles of the present disclosure. These charge carrier trap trenches 56 may intersect with one another or be completely separate from one another.

Charge carrier trap trenches have previously been used to isolate various components from one another in the device layer of an SOI semiconductor die and to reduce cross-talk and other interference caused by the accumulation of charge carriers at the interface of the substrate and the insulating layer, however, these charge carrier trap trenches are generally spaced relatively far apart from one another in order to accommodate a large number of devices concentrated in a single area. As a result, the total area of these charge carrier trap trenches is limited to a small portion (e.g., <5%) of the total area of an SOI semiconductor die. In other words, conventional design practices using charge carrier trap trenches have been to lay out the devices in the device layer as desired (generally as close to one another as possible), and then provide charge carrier trap trenches in places where they fit between components. This often results in charge carrier trap trenches that are relatively far apart from one another, such that a large cross-sectional area at the interface of the substrate and the insulating layer of an SOI semiconductor die is still available for the induction of eddy currents. The objective of the present disclosure is to break up the area available for accumulation of charge carriers such that eddy currents induced in an SOI semiconductor die can be significantly reduced. Accordingly, the charge carrier trap trench 56 is applied in a specific manner (e.g., in a grid as discussed above) in order to separate the area at the interface of the substrate 44 and the insulating layer 46 into a number of discontinuous smaller areas with a size as discussed above.

Arranging the device layout areas 54 as described above may increase the difficulty of laying out devices in the semiconductor die 42. This difficulty may increase as the area of the device layout areas 54 decreases. Accordingly, a balance may be struck between the area of the device layout areas 54 in order to reduce eddy currents to an acceptable level while maintaining the ability of a designer to properly layout devices in the device layer 48. Notably, surface-level components such as conductive traces can be laid over the charge carrier trap trench 56, and this area may therefore be dedicated to the routing of surface traces or placing of metal or polysilicon capacitors and resistors on the semiconductor die 42.

As shown in FIGS. 3A and 3B, the charge carrier trap trench 56 forms a grid pattern, thereby separating the device layer 48 into a number of device layout areas 54. The area of the device layout areas 54 as measured by a device layout area length $L_{DA}$ and a device layout area width $W_{DA}$ may be between about 1.0 µm$^2$ and 100.0 µm$^2$ in some embodiments.

FIGS. 4 and 5A-5G illustrate a method for manufacturing the resonator 36 according to one embodiment of the present disclosure. First, the semiconductor die 42 is provided including the substrate 44, the insulating layer 46, and the device layer 48 (step 200 and FIG. 5A). A combination mask/shield 62 is then placed over the device layer 48 (step 202 and FIG. 5B). A trench 64 is then etched through the exposed portions of the device layer 48 and the insulating layer 46 and into a portion of the substrate 44 (step 204 and FIG. 5C). The exposed trenches 64 are then radiated (step 206 and FIG. 5D), resulting in the trap-rich implants 60. The mask/shield 62 is then removed (step 208 and FIG. 5E), and the trenches 64 are filled with an insulating material (step 210 and FIG. 5F), thereby forming the charge carrier trap trench 56 and the device layout areas 54. One or more devices may then be provided in the device layout areas 54 using well known semiconductor fabrication processes (not shown), and the flip chip pillars provided (also not shown). Finally, the semiconductor die 42 is attached to the laminate 38 (step 212 and FIG. 5G) to form the resonator 36.

Figure 6:
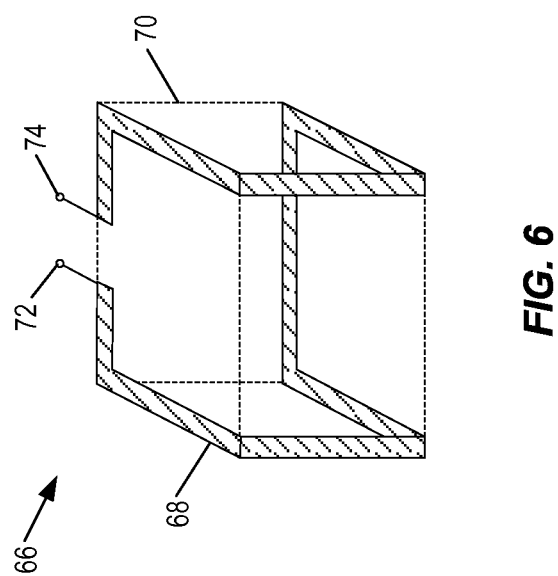
FIG. 6 illustrates a three-dimensional inductor according to one embodiment of the present disclosure.

In one embodiment, the inductive element 40 is a three-dimensional inductor. Accordingly, FIG. 6 shows an exemplary three-dimensional inductor 66 according to one embodiment of the present disclosure. The three-dimensional inductor 66 includes a conductive path 68, which is routed within and supported by a laminate 70 (shown as transparent to highlight details of the conductive path 68). Notably, various portions of the conductive path 68 are folded over other portions thereof, creating a cancellation of the magnetic field in these sections. Given the fact that the length of the conductive path 68 is relatively long in comparison to the inductance value of the three-dimensional inductor 66, delays are introduced between an input node 72 and an output node 74 of the three-dimensional inductor 66, which creates a distributed inductance effect. This may increase the performance of the three-dimensional inductor 66 when compared with conventional inductive elements. Further, the magnetic field of the three-dimensional inductor 66 is confined mainly to the interior of the device, which results in a very small coupling to adjacent structures, thereby avoiding undesirable signal leakage. In general, using the three-dimensional inductor 66 in the resonator 36 may increase the performance thereof.

While shown in a particular shape, the three-dimensional inductor 66 may be provided in any number of shapes and sizes without departing from the principles of the present disclosure.

Figure 7:
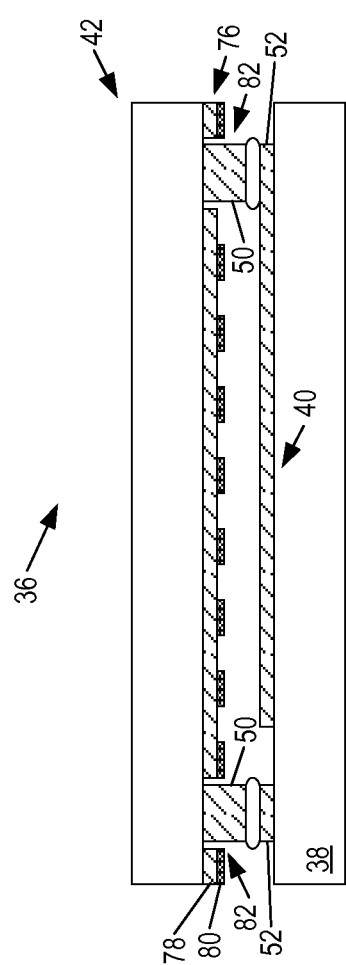
FIG. 7 is a cross-sectional view of a resonator according to one embodiment of the present disclosure.
Figure 8:
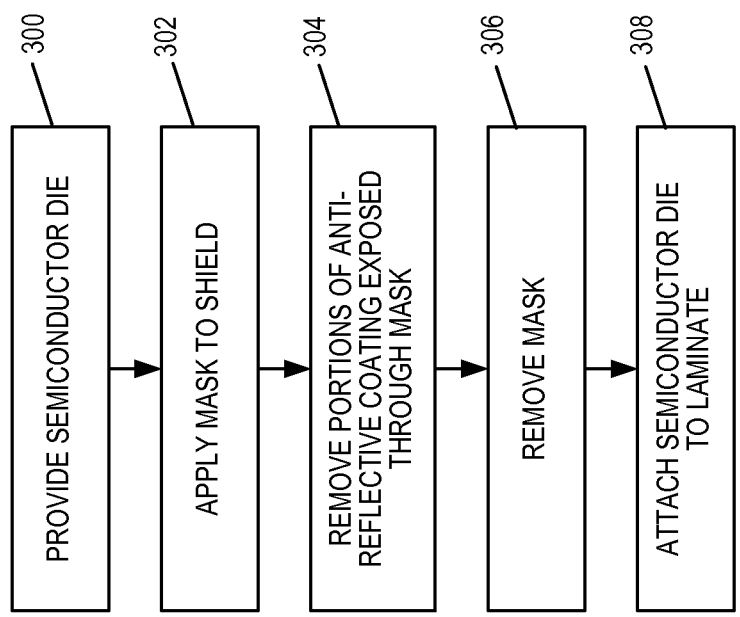
FIG. 8 is a flow chart describing a method for manufacturing a resonator according to one embodiment of the present disclosure.
Figure 9A:
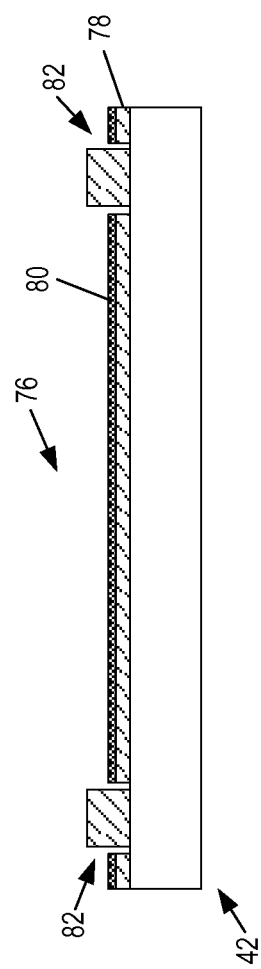
Figure 9B:
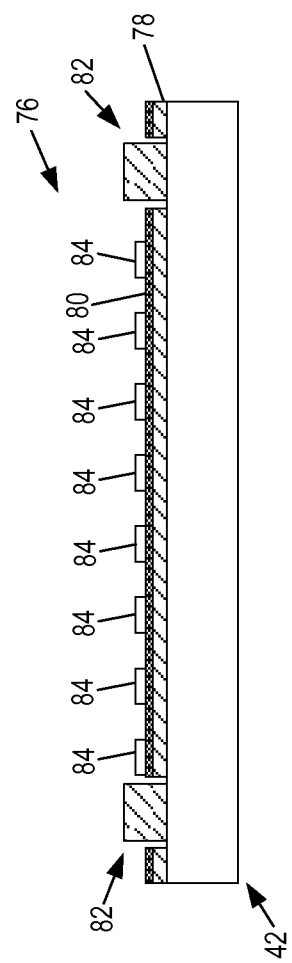
Figure 9C:
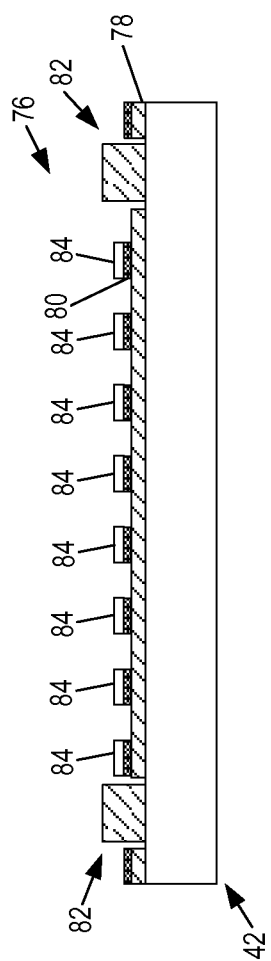
Figure 9E:
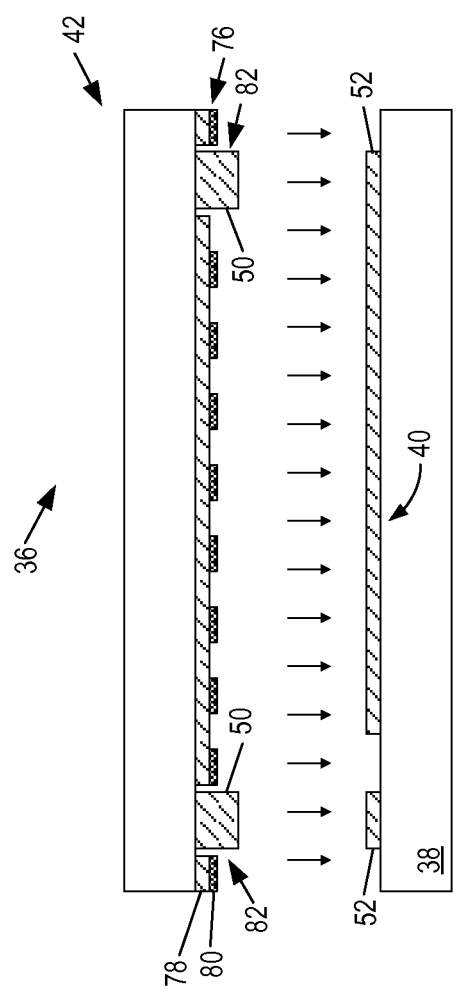

As discussed above, another way to reduce eddy currents in the semiconductor die 42 is by using an electromagnetic shield placed between the inductive element 40 and the semiconductor die 42. Generally speaking, such shields are implemented on the semiconductor die 42, and in particular on the device layer 48. Due to the anti-reflective coatings present on many semiconductor die, problematic eddy currents may instead be induced in the shield rather than in the semiconductor die 42. Accordingly, FIG. 7 shows the resonator 36 according to an additional embodiment of the present disclosure including a shield 76 on the semiconductor die 42 configured to reduce eddy currents therein. The resonator 36 shown in FIG. 7 is substantially similar to that shown above with respect to FIGS. 3A and 3B, except that the resonator 36 shown in FIG. 7 further includes the shield 76 between the inductive element 40 and the semiconductor die 42. Further, the semiconductor die 42 is shown without the insulating layer 46 and the device layer 48, as the principles described herein with respect to the shield 76 are not exclusive to SOI semiconductor die. The shield 76 includes a metal base layer 78 and an anti-reflective coating 80. A number of openings 82 allow the flip-chip pillars 50 to be provided through the shield 76.

The metal base layer 78 may be any suitable shielding material. For example, the metal base layer 78 may be copper, aluminum, or the like in some embodiments. The anti-reflective coating 80 may similarly be any suitable anti-reflective coating. For example, the anti-reflective coating 80 may be titanium nitride in some embodiments. As discussed above, due to the fact that the resistivity of many anti-reflective coatings is low enough to induce a significant eddy current and high enough to produce a magnetic field that significantly interferes with nearby inductive elements, the anti-reflective coating 80 may be particularly problematic in the resonator 36. Accordingly, the anti-reflective coating 80 is patterned in FIG. 7 to counteract this effect. Patterning the anti-reflective coating 80 involves removing a portion thereof. In some embodiments, patterning the anti-reflective coating 80 may involve removing portions of the anti-reflective coating 80 such that the remaining portions of the coating are arranged in a grid and have an area less than about 100.0 μm$^2$ for each portion thereof. Further, patterning the anti-reflective coating 80 may involve removing a certain percentage of the anti-reflective coating 80 (e.g., 50%) and/or reducing the size of any continuous area of the anti-reflective coating 80 to a desired value (e.g., 100.0 μm$^2$). In one embodiment, the anti-reflective coating 80 is patterned such that at least one dimension of the remaining portions thereof is smaller than about 250 μm.

The anti-reflective coating 80 may be removed by any suitable means. In general, a well-known pad preparation process may be suitable for removing portions of the anti-reflective coating 80 and thus may be used accordingly.

FIGS. 8 and 9A-9E illustrate a method for manufacturing the resonator 36 shown in FIG. 7 according to one embodiment of the present disclosure. First, the semiconductor die 42 is provided including the shield 76 (step 300 and FIG. 9A). As discussed above, the shield 76 includes the metal base layer 78 and the anti-reflective coating 80. Generally, the shield 76 is an on-chip grounded shield that is implemented on the semiconductor die 42. Accordingly, the process described below is performed before the semiconductor die 42 is attached to the laminate 38. A mask 84 is applied on the shield 76 (step 302 and FIG. 9B), and the exposed portions of the anti-reflective coating 80 are etched away (step 304 and FIG. 9C). Any suitable etching process (or other suitable removal process) may be used to remove the exposed portions of the anti-reflective coating 80 without departing from the principles of the present disclosure. The mask 84 may be provided in any desired pattern. For example, the mask 84 may be provided such that the anti-reflective coating 80 is patterned into a grid. In other embodiments, the mask 84 may be provided such that a desired percentage of the anti-reflective coating 80 is removed. In other embodiments, the entire anti-reflective coating 80 is removed, and thus the mask 84 is not provided. The mask 84 is then removed (step 306 and FIG. 9D), and the semiconductor die 42 is attached to the laminate 38 (step 308 and FIG. 9E).

Figure 10:
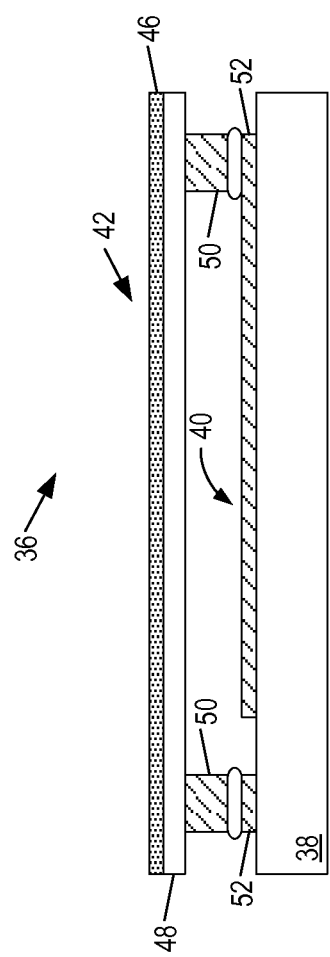
FIG. 10 is a cross-sectional view of a resonator according to one embodiment of the present disclosure.

Another way to reduce eddy currents in the semiconductor die 42 is by removing the substrate 44 altogether. Accordingly, FIG. 10 shows the resonator 36 according to an additional embodiment of the present disclosure. The resonator 36 shown in FIG. 10 is substantially similar to that shown in FIGS. 3A and 3B, but does not include the substrate 44. In such a design, the substrate 44 is etched, grinded, or otherwise removed from the resonator 36, either before or after the semiconductor die 42 has been attached to the laminate 38. While the substrate 44 is shown being completely removed, only those portions of the substrate exposed to strong magnetic fields may also be removed without departing from the principles of the present disclosure. Without the substrate 44, there are no charge carriers to collect at the interface of the substrate 44 and the insulating layer 46 to form a cross-sectional area of low resistivity. Accordingly, eddy currents in the semiconductor die 42 due to the inductive element 40 are significantly reduced, thereby improving the performance of the resonator 36.

Yet another way to reduce eddy currents in the semiconductor die 42 is by carefully arranging the position of the inductive element 40 and the position of the semiconductor die 42 with respect to one another. Generally, an inductive element may provide a larger or smaller magnetic field to the surrounding environment depending on the particular orientation thereof. To take the three-dimensional inductor 66 described above in FIG. 6 as an example, a larger magnetic field will generally be present at the "mouth" of the inductor, or the open side of the inductor between the input node 72 and the output node 74. Accordingly, placing a semiconductor die over this area of the three-dimensional inductor 66 will result in the generation of additional eddy currents and thus further reduce the quality factor of a resonator in which the three-dimensional inductor 66 is provided. By minimizing the amount of a semiconductor die placed over the mouth of the three-dimensional inductor 66, or indeed any portion of an inductor in which an enhanced magnetic field is present, the total eddy current induced in the semiconductor die can be reduced, thereby improving the performance of a resulting resonator.

Figure 11:
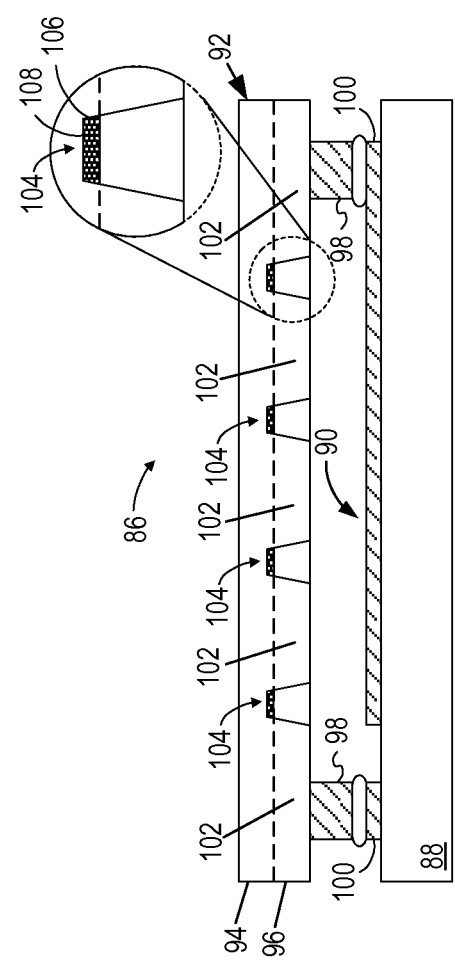
FIG. 11 is a cross-sectional view of a resonator according to one embodiment of the present disclosure

As discussed above, the principles described in the present disclosure are not limited to SOI semiconductor die. Accordingly, FIG. 11 shows a cross-sectional view of a resonator 86 according to an additional embodiment of the present disclosure. The resonator 86 shown in FIG. 11 is substantially similar to that discussed above with respect to FIGS. 3A and 3B, but does not include an insulating layer separating the substrate and the device layout area. Specifically, the resonator 86 includes a laminate 88, an inductive element 90 on the laminate 88, and a semiconductor die 92 over at least a portion of the inductive element 90 on the laminate 88. The semiconductor die 92 may be any type of semiconductor die having a relatively low-resistivity substrate. For example, the semiconductor die may be a bulk complementary metal-oxide semiconductor (CMOS) semiconductor die, a bi-CMOS semiconductor die, a Silicon bipolar semiconductor die, a Silicon-Germanium semiconductor die, or the like. The semiconductor die 92 may include a substrate 94 and a device layout area 96. While not shown, one or more semiconductor devices (e.g., transistors, capacitors, etc.) may be located in the device layout area 96 and connect to the inductive element 90 (and possibly other semiconductor components on the laminate 88 or on semiconductor dies attached to the laminate 88), for example, via one or more flip-chip pillars 98, which may connect to one or more bonding pads 100 on the laminate 88 via a soldering process. In particular, one or more capacitive elements (not shown), which may be MIM capacitors located in the semiconductor die 92, may connect to the inductive element 90 directly or via one or more switching elements (e.g., transistors) to form the resonator 86. The substrate may have a resistivity between 0.1 Ω·cm and 15 Ω·cm.

Notably, as discussed above, a layer of charge carriers may accumulate in the relatively low-resistivity substrate 94, resulting in the induction of a strong eddy current therein by the inductive element 90. Accordingly, the device layout area 96 of the semiconductor die 92 is separated into a number of device layout sub-areas 102 by a charge carrier trap trench 104. The charge carrier trap trench 104 effectively breaks the area of the substrate 94 available for charge carrier collection into a number of smaller areas, which reduces the eddy current generated therein and thus prevents interference with the magnetic field of the inductive element 90. This in turn prevents reductions in the quality factor of the inductive element 90 that are often associated with eddy currents.

The charge carrier trap trench 104 may include a trap-rich implant 106 in a bottom surface 108 thereof. The remainder of the charge carrier trap trench 104 may be formed from the same material as that of the substrate 94, but may be doped to form a region of relatively high resistivity.

The device layout sub-areas 102 may have similar dimensions to those discussed above with respect to FIGS. 3A and 3B, such that the area of each one of the device layout sub-areas 102 is between about 1.0 $\mu m^2$ and 100.0 $\mu m^2$. Additionally, different portions of the charge carrier trap trench 104 may be less than 200 μm away from one another and as close together as 10 μm. Further, the charge carrier trap trench 104 may account for at least 10% of the total area of the device layout area 96 and as much as 50% thereof. The charge carrier trap trench 104 may penetrate into the device layout area 96 such that the charge carrier trap trench has a depth between about 5 μm and 100 μm.

The resonator 86 may be made by a similar process as that described above in FIGS. 4 and 5A through 5G, and will thus be appreciated by those skilled in the art in light of these figures and the corresponding description thereof.

Those skilled in the art will recognize improvements and modifications to the embodiments of the present disclosure. All such improvements and modifications are considered within the scope of the concepts disclosed herein and the claims that follow.

What is claimed is:

1. A resonator comprising:
   a laminate;
   an inductive element on the laminate; and
   a semiconductor die coupled to the inductive element, the semiconductor die comprising
      a substrate; and
      a device layout area on the substrate, the device layout area comprising a plurality of device layout sub-areas separated by a charge carrier trap trench such that an area of each one of the plurality of device layout sub-areas is between about 1.0$\mu^2$ and 100.0$\mu^2$;
      wherein the plurality of device layout sub-areas are arranged in a grid.

2. The resonator of claim 1 wherein the semiconductor die is a silicon-on-insulator (SOI) semiconductor die comprising an insulating layer between the substrate and the device layout area.

3. The resonator of claim 2 wherein the charge carrier trap trench runs through the device layout area and the insulator layer such that a bottom surface of the charge carrier trap trench is in the substrate.

4. The resonator of claim 3 wherein the charge carrier trap trench comprises a trap-rich implant in the bottom surface thereof, the trap-rich implant configured to prevent a collection of charge carriers at an interface between the substrate and the insulator layer.

5. The resonator of claim 4 wherein the charge carrier trap trench is filled with an oxide material.

6. The resonator of claim 1 wherein the inductive element is a three-dimensional inductor.

7. The resonator of claim 1 wherein the resonator has a quality factor between about 50 and 1000.

8. The resonator of claim 1 further comprising a plurality of devices in the plurality of device layout sub-areas which are electrically coupled to the inductive element.

9. The resonator of claim 1 wherein the charge carrier trench comprises the same material as the substrate with a high-resistivity dopant added thereto.

10. The resonator of claim 1 wherein the SOI semiconductor die is at least partially over the inductive element.

11. The resonator of claim 1 wherein the SOI semiconductor die is completely over the inductive element.

12. A resonator comprising:
a laminate;
an inductive element on the laminate; and
a semiconductor die coupled to the inductive element, the semiconductor die comprising
a substrate; and
a device layout area on the substrate, the device layout area comprising a plurality of device layout sub-areas separated by a charge carrier trap trench such that the plurality of device layout sub-areas are arranged in a grid; wherein each device layout area has a width between about 10μm and 200μm.

* * * * *

UNITED STATES PATENT AND TRADEMARK OFFICE
CERTIFICATE OF CORRECTION

| | | |
|---|---|---|
| PATENT NO. | : 9,653,772 B2 | Page 1 of 1 |
| APPLICATION NO. | : 14/931621 | |
| DATED | : May 16, 2017 | |
| INVENTOR(S) | : George Maxim et al. | |

It is certified that error appears in the above-identified patent and that said Letters Patent is hereby corrected as shown below:

In the Claims

In Column 10, Line 48, Claim 1, replace "$1.0\mu^2$ and $100.0\mu^2$;" with --$1.0\mu m^2$ and $100.0\mu m^2$;--.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*